United States Patent
Hirst

(12) 
(10) Patent No.: US 6,710,309 B1
(45) Date of Patent: Mar. 23, 2004

(54) USE OF THE TEMPERATURE GRADIENT TO DETERMINE THE SOURCE VOLTAGE

(75) Inventor: B. Mark Hirst, Boise, ID (US)

(73) Assignee: Hewlett-Packard Development Company, L.P., Houston, TX (US)

(*) Notice: Subject to any disclaimer, the term of this patent is extended or adjusted under 35 U.S.C. 154(b) by 0 days.

(21) Appl. No.: 08/704,217

(22) Filed: Aug. 23, 1996

(51) Int. Cl.[7] ................................................ H05B 1/02
(52) U.S. Cl. ....................................... 219/492; 219/492
(58) Field of Search ................................ 219/492, 494, 219/497, 499, 501, 505, 481, 488; 340/588, 589; 374/102, 107

(56) References Cited

U.S. PATENT DOCUMENTS

| | | | | |
|---|---|---|---|---|
| 3,863,049 A | * | 1/1975 | Hinman ....................... 219/389 |
| 4,432,211 A | * | 2/1984 | Oishi et al. ..................... 62/234 |
| 4,549,073 A | * | 10/1985 | Tamura et al. ............... 219/497 |
| 4,570,054 A | * | 2/1986 | Chidzey et al. ............. 219/490 |
| 4,928,055 A | | 5/1990 | Kaieda et al. ............... 323/300 |
| 4,929,930 A | * | 5/1990 | Rezabek ....................... 340/622 |
| 5,099,108 A | * | 3/1992 | Kimura et al. ............... 219/497 |
| 5,483,149 A | | 1/1996 | Barrett ........................ 323/300 |

* cited by examiner

Primary Examiner—Teresa Walberg
(74) Attorney, Agent, or Firm—Anthony J Baca

(57) ABSTRACT

A means for determining the voltage of a power source is disclosed. A portion of the available power from the power source is applied to a heating element. By measuring a rate of change in the temperature of the heating element the input voltage can be determined.

6 Claims, 5 Drawing Sheets

USE OF THE TEMPERATURE GRADIENT TO DETERMINE THE SOURCE VOLTAGE

CROSS-REFERENCE TO RELATED APPLICATION

The present application is related to the following co-pending U.S. patent applications being assigned to the same assignee and filled on the same date, entitled:

"A METHOD FOR REDUCING FLICKER IN ELECTROPHOTOGRAPHIC PRINTERS AND COPIERS", Ser. No. 08/701,899 incorporated herein by reference.

"A REDUCED FLICKER FUSING SYSTEM FOR USE IN ELECTROPHOTOGRAPHIC PRINTERS AND COPIERS", Ser. No. 08/704,216 incorporated herein by reference; and "A UNIVERSAL POWER SUPPLY FOR MULTIPLE LOADS", Ser No. 08/697,387 incorporated herein by reference.

TECHNICAL FIELD

This invention relates generally to power control systems and more particular to a method and apparatus for determining the source voltage supplied to a resistive heating element.

BACKGROUND OF THE INVENTION

Starting in approximately 1984, low cost personal laser printers became available. All dry electrophotographic copiers and printers develop an image utilizing a dry toner. The typical toner is composed of styrene acrylic resin, a pigment-typically carbon black, and a charge control dye to endow the toner with the desired tribocharging properties for developing a latent electrostatic image. Styrene acrylic resin is a thermo-plastic which can be melted and fused to the desired medium, typically paper.

The typical fusing system in an electrophotographic printer or copier is composed of two heated platen rollers which, when print media with a developed image pass between them, melt the toner and through pressure physically fuse the molten thermal plastic to the medium. Heating is usually accomplished by placing a high power tungsten filament quartz lamp inside the hollow platen roller.

The heating element in the fusing system provides enough heat to properly fuse the toner to the medium. The fusing system must compensate for different media types, changes in ambient environmental temperature, as well as dramatic changes in relative humidity. Relative humidity variations greatly affect the fusing system due to the hygroscopic properties of both the print media and the toner itself. When relative humidity is high both the media and toner absorb a large percentage of their dry mass in water that is essentially boiled off during the fusing process thus decreasing the amount of energy available for melting the toner for adhesion to the media. Thus, the fusing system must accommodate a large variety of environmental conditions as well as differing media demands.

Presently, most printer and copier fusing systems and their temperature control systems are not designed to compensate for differing media types or changes in relative humidity. The typical fusing system is designed with a heating element capable of providing enough heat to deal with all foreseen media and relative humidity conditions with little or no concern to the resulting poor power quality that results. Some relatively new printers do utilize relative humidity sensors to adjust print quality and optical sensors to differentiate between paper and overhead transparencies. These additional sensors, which are being added to the printing mechanisms in order to improve image quality, can also be utilized by the fuser control systems to improve temperature regulation as well as improve the power quality of the overall printing system.

There are numerous reasons to intelligently control a electrophotographic printer or copier fusing system in a much more aggressive manner. For example, intelligent control can result in a universal fuser that can be shipped to any commercial market worldwide regardless of the power system. A universal fuser has the attractive benefit of requiring a single part for both manufacture and field service replacement. The manufacturer is relieved of the burden of manufacturing 110 VAC and 220 VAC printers. The need to stock two types of service parts is eliminated, and product distribution centers now have one product that can be shipped to any country in the world without any reconfiguration requirements. There are reduced logistical burdens for sales, distribution and manufacture scheduling. As can be expected there is a large financial advantage to be gained by producing only a single version of a product for worldwide consumption.

For a dry electrophotographic fusing system to operate worldwide it must be able to operate satisfactorily on AC power systems providing from 90 Vrms to 240 Vrms at frequencies of 50 Hz to 60 Hz. The fusing system must heat up from ambient room temperature to operating temperature as quickly as possible while exhibiting extremely low flicker as its power consumption level changes. The fusing system, when combined with the balance of the electrophotographic printer power electronics, must meet International Electrical Commission (IEC) regulations IEC 555-2 and IEC 555-3 for current harmonics and flicker. The printer or copier must pass Federal Communications Commission (FCC) class B regulations for power line conducted emissions and radiated emissions. In addition, the printer must pass CISPR B requirements for power line conducted emissions and radiated emissions. Finally, the printer must not suffer from excessive acoustic multi-tone or single tone emissions in the human auditory range in the office environment. The fusing system must be capable of switching into a power down or power off mode for energy savings as suggested by the EPA Energy Star Program. The absolute cost of any additional electronics is limited to no more than the cost benefit of not stocking multiple 110 VAC and 220 VAC models.

U.S. Pat. No. 5,483,149 to Barrett (herein referred to as Barrett) shows that a universal fuser may be obtained through the use of a modified integral half cycle (IHC) power controller but without solving the flicker problem. The method taught by Barrett has been shown to suffer some flicker problems as well as placing current sub-harmonics on the AC power system. Currently no regulation exists regarding AC current sub-harmonic content. It is sufficient to note that AC current sub-harmonics are unwanted on the power grid and that AC current sub-harmonics in the 4 Hz to 20 Hz range significantly contributes to the flicker level exhibited by an electrical device. However, Barrett requires that the input voltage be known.

Other methods such as phase control, in which a triac's conduction angle is ramped up relatively slowly, have proven to yield a universal fusing system which meets IEC 555-3 specifications for flicker yet fails IEC 555-2 specifications for current harmonics. Triac gate phase control also fails conducted power line emission specifications unless excessive additional power filtering is added. In U.S. Pat. No. 4,928,055 to Kaieda et al. (herein referred to as Kaieda)

a fuser power control system based on phase delay gated triac control of an AC heating system is taught. While Kaieda was only interested in power control, through proper temperature control algorithm design as taught in co-pending application "A METHOD FOR REDUCING FLICKER IN ELECTROPHOTOGRAPHIC PRINTERS AND COPIERS", Ser No. 08/701,899, their solution could greatly reduces the flicker problem while yielding a universal fuser. However, this solution requires detailed information and the associated expense of voltage magnitude as well as zero cross information for proper triac gate control. This system also suffers from excessive current harmonics as well as places large amounts of conducted emissions on the power grid.

SUMMARY OF THE INVENTION

The present invention provides an apparatus for determining an input voltage of a power source. The apparatus has a heating element and a temperature sensor that monitors the temperature of the heating element. A portion of the available power from the power source is applied to the heating element. By measuring a rate of change in the temperature of the heating element the input voltage can be determined.

Once the input voltage has been determined, a temperature control process is used to maintain the temperature of the heating element.

BRIEF DESCRIPTION OF THE DRAWINGS

A better understanding of the invention may be had from the consideration of the following detailed description taken in conjunction with the accompanying drawings in which.

DETAILED DESCRIPTION OF THE PREFERRED EMBODIMENTS

Figure 1:
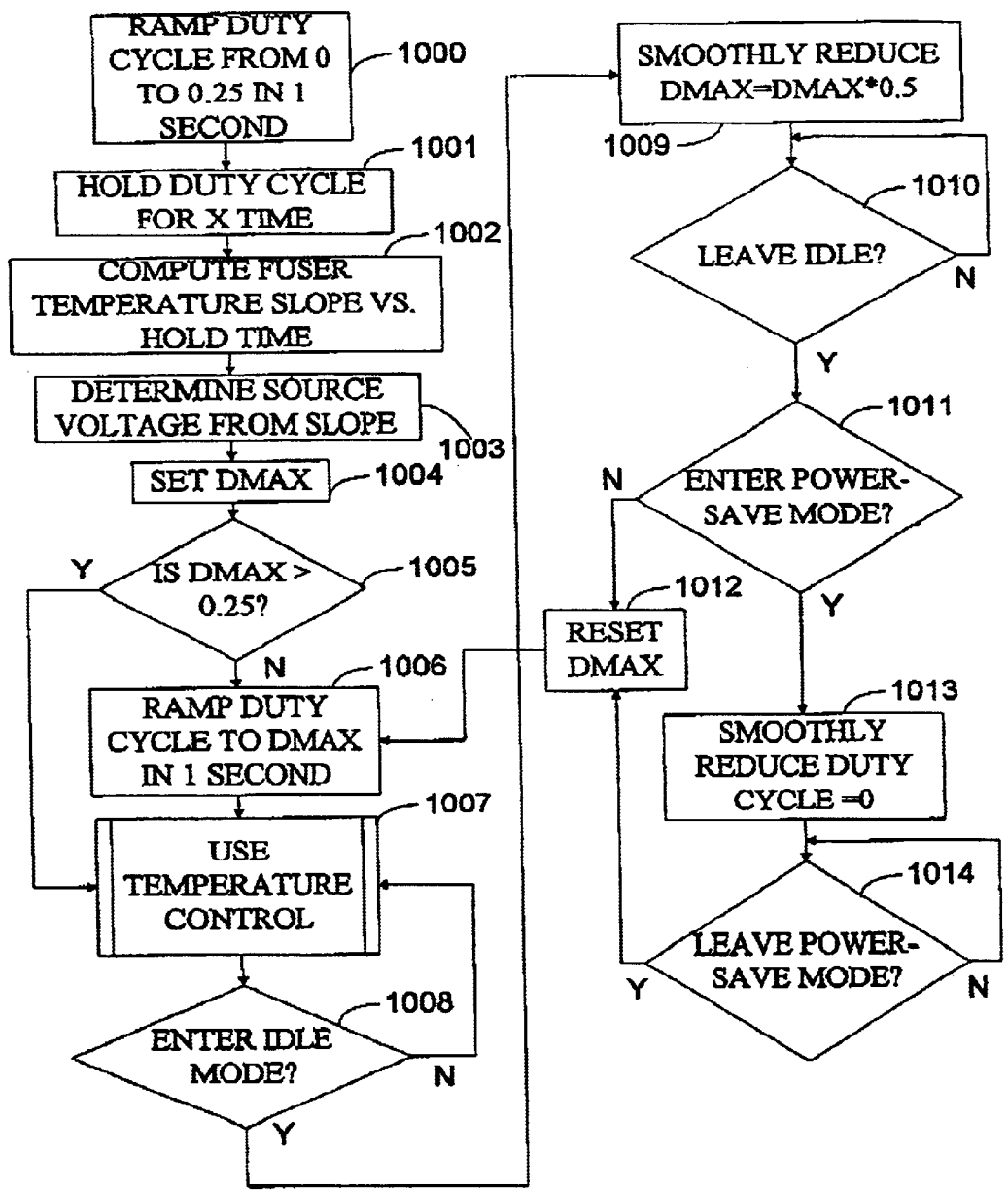
FIG. 1 is a flow chart showing the overall control process.
Figure 2:
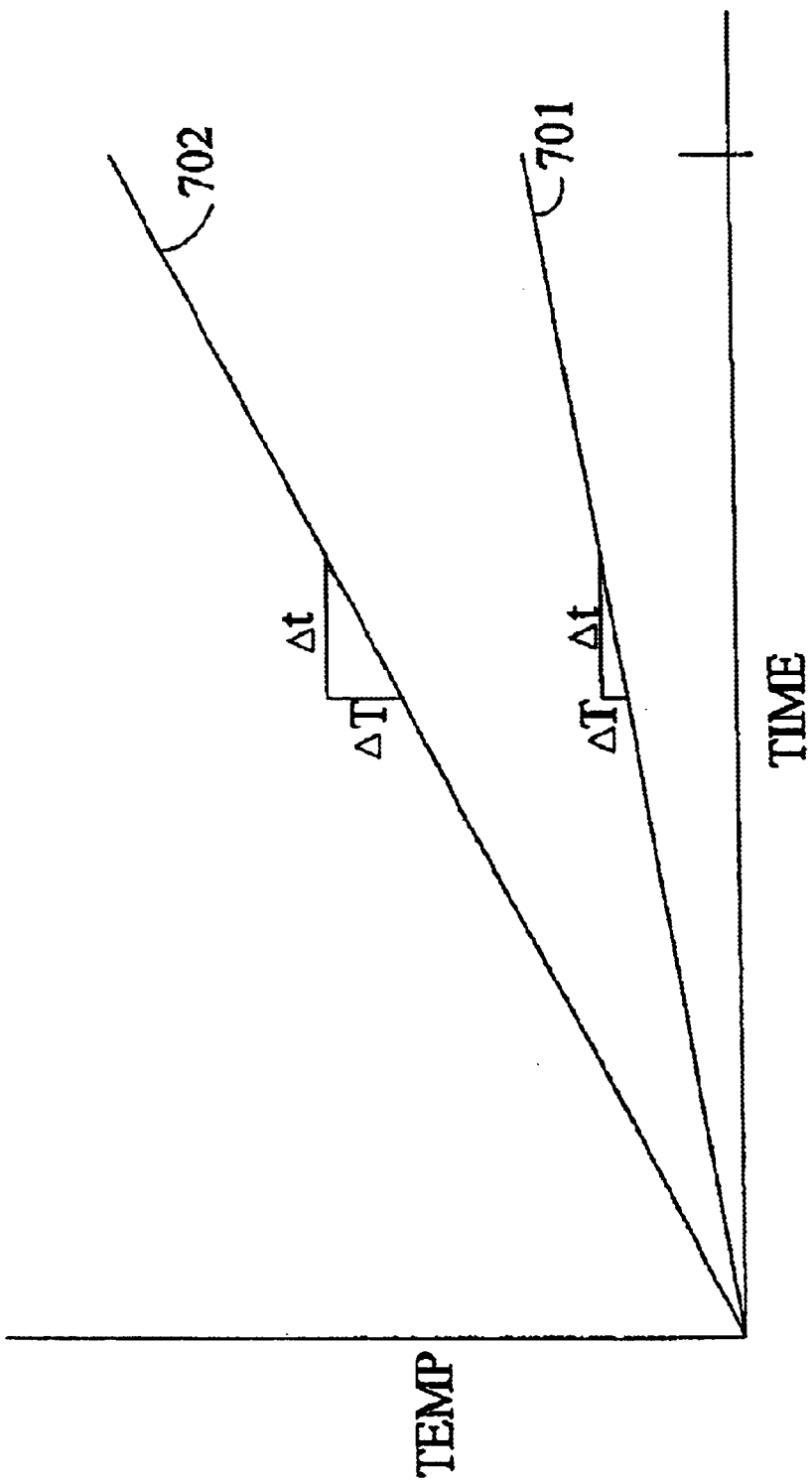
FIG. 2 is a graph showing the different temperature slopes as a result of different input voltages
Figure 3:
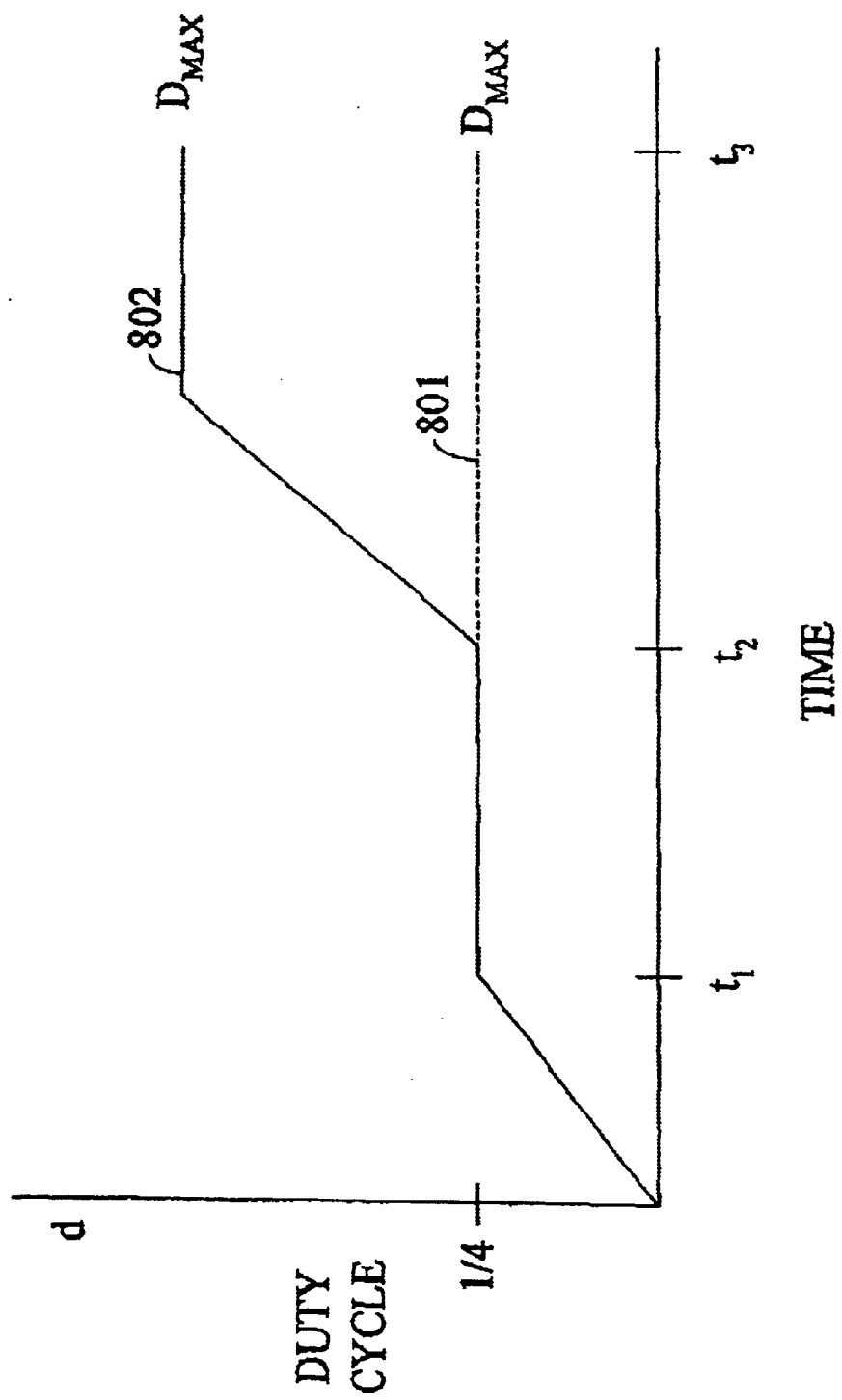
FIG. 3 shows a profile of the duty cycle against time.

The present invention is not limited to a specific embodiment illustrated herein. Referring now to FIGS. 1, 2, and 3 the preferred embodiment of the overall control system will be described. For safety and product reliability reasons, before the control system can start to control the fuser system, the input voltage must be determined. To accomplish this, the duty cycle of the power control electronics is ramped from 0 to 0.25 over a $t_1$ period 1000. The ramp interval may be shorter of longer, however, the preferred embodiment uses $t_1$=1s. Also, the final value of 0.25 correlates to the maximum value of the duty cycle for the highest specified input voltage of 220 Vrms. Other fuser systems may have a different value associated with the maximum voltage. In particular, the power electronics in the preferred embodiment exhibit a power usage of:

$$P = \frac{V^2 d}{R}$$

where d=duty cycle. Thus, limiting the duty cycle (d) to 0.25 insures the maximum power drawn from a 220 Vrms source is no greater than the amount of power drawn from a 110 Vrms source when d=1.

The duty cycle is held 1001 at 0.25 for a period of time $t_2$-$t_1$. The exact amount of time $t_2$-$t_1$ must be determined for each application as it depends on the thermal mass and transport lag of the fuser system. A time of 20 seconds was used for the fuser system of the printer under test. The temperature slope ($\Delta T/\Delta t$) is determined from the time interval $\Delta t$ and the fuser temperature $\Delta T$ 1002. From the temperature slope, the source voltage can be determined 1003. In particular, line 701 of FIG. 2 corresponds to an input voltage of 110 Vrms while line 702 corresponds to an input voltage of 220 Vrms.

To insure safe and reliable operation of the fuser, a maximum duty cycle ($D_{MAX}$) is assigned based on the source voltage 1004. In the preferred embodiment $D_{MAX}$ was empirically determined such that if the source voltage is $\leq$110 Vrms, then $D_{MAX}$=1.0; if source voltage=127 Vrms, then $D_{MAX}$=0.75; and if the source voltage=220 Vrms, then $D_{MAX}$=0.25. If the duty cycle is not already at $D_{MAX}$ 1005, then it is ramped up to $D_{MAX}$ over a 1 second period 1006 $t_3$. Referring to FIG. 3, given an input voltage of 220 Vrms, $D_{MAX}$ has already been reached by $t_2$. For a system operating at a lower voltage, the duty cycle is increased from 0.25 to $D_{MAX}$ as shown in line 802.

After the duty cycle has reached $D_{MAX}$, the temperature control process for maintaining the proper temperature is invoked. Knowledge of the exact process is not necessary for one skilled in the art to understand the present invention.

With renewed reference to FIG. 1, once printing is complete, the fuser enters the idle mode 1008, by reducing $D_{MAX}$ by 50%. The printer may exit the idle mode 1010 to enter either the printing mode or the power save mode. If the printer enters power save, mode, 1011, power to the fuser if turned off by setting the duty cycle to 0 (1013). To exit either power save or idle mode, $D_{MAX}$ must be reset 1012 to its original value as determined in 1004.

Figure 4:
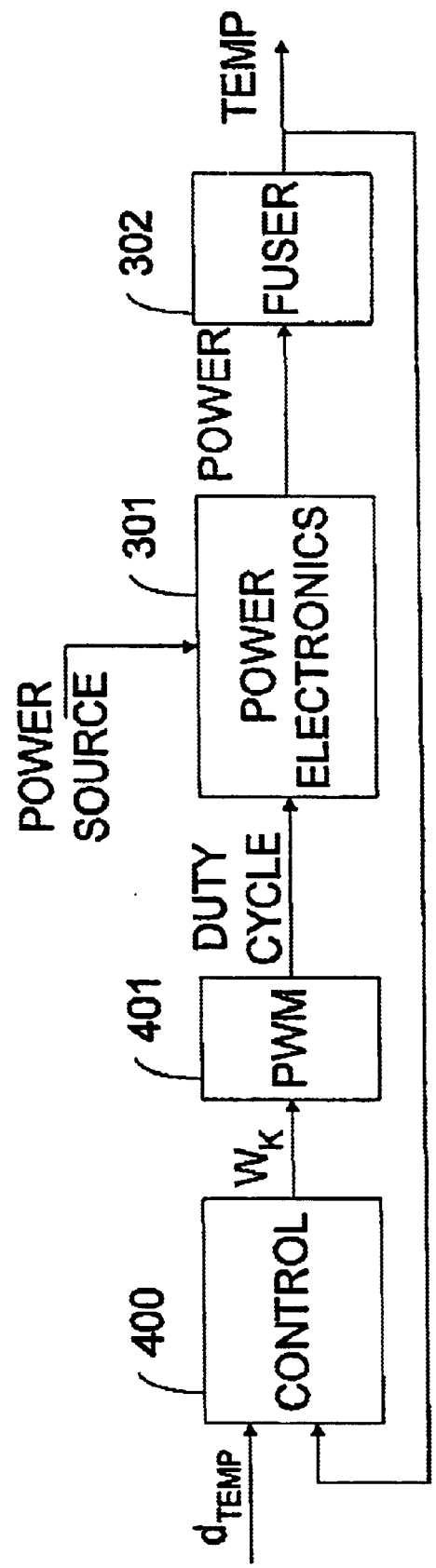
FIG. 4 is a block diagram of overall fusing temperature control system as used in the present invention.
Figure 5:
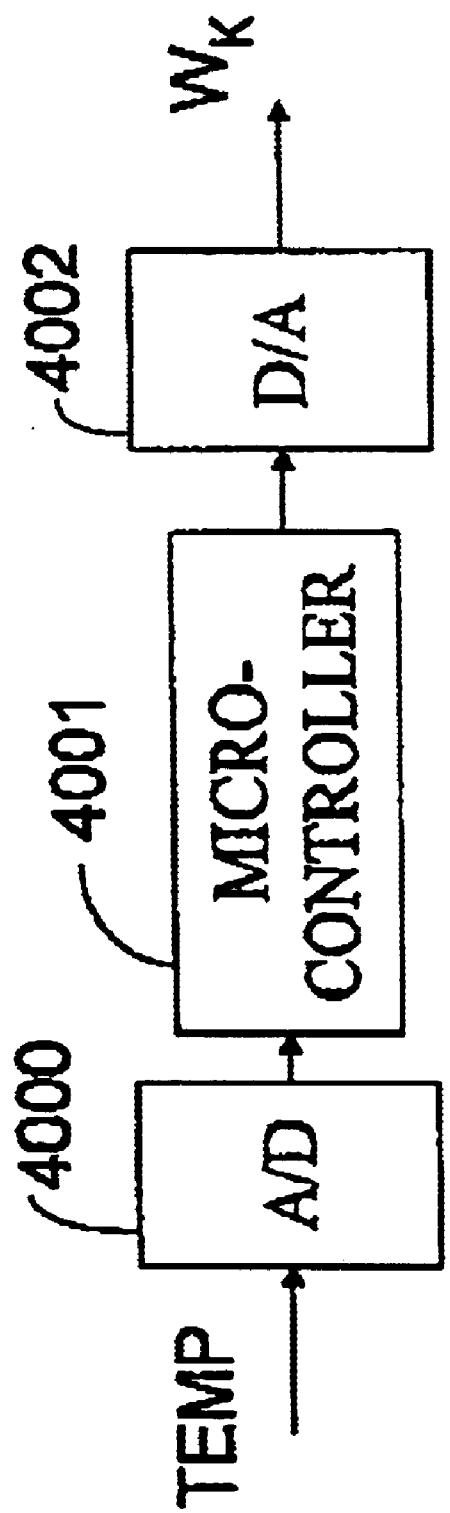
FIG. 5 is a block diagram of the controller of FIG. 4.

A view of the arrangement of the temperature control system and the configuration of the physical components showing the pulse width modulator 401, power source, power electronics 301, fusing system 302, and temperature controller 400 is given in FIG. 4. The temperature control system of FIG. 4 utilizes only one feedback quantity, the temperature of the fusing system 302. This results in the lowest cost implementation as an extremely low cost microcontroller (4001 of FIG. 5) may be used to implement the control system 400. The fuser temperature is sampled by A/D converter 4000 and used by the microprocessor 4001 that is executing the temperature control program 1007. The result of the temperature control program 1007 is supplied to D/A converter 4002. The analog output from D/A converter 4002 controls PWM 401. One skilled in the art will understand that the PWM may reside within the microcontroller 4001 thereby eliminating the need of D/A converter 4002 and PWM 401 While the above has been described in terms of controlling the power input to the heating element by directly changing the duty cycle, one skilled in the art will understand that the same task could be performed, for example, by changing the phase control of Kaieda or the number of IHC of Barrett.

Although the preferred embodiment of the invention has been illustrated, and that form described, it is readily apparent to those skilled in the art that various modifications may be made therein without departing from the spirit of the invention or from the scope of the appended claims.

What is claimed is:

1. An apparatus said apparatus comprising:
   a power source;
   a heating element;

a means for sensing a temperature of said heating element; and a controller means for controlling an amount of power transferred from said power source to said heating element, said controller means smoothly increasing said power transferred to a portion of power available from said power source, said controller means through said means for sensing measuring a rate of change in said temperature of said heating element, said controller means using said rate of change to determine a voltage of said power source.

2. The apparatus of claim 1 wherein said controller means further maintains said temperature of said heating element at an operating temperature.

3. The apparatus of claim 1 wherein said controller means selects said portion of power such that said temperature of said heating element remains below a maximum value for a maximum voltage.

4. A method for determining a voltage of a power source to an imaging device, said method comprising the steps of:

passing a portion of power from said power source to a heating element;

measuring a rate of change in a temperature of said heating element; and determining said voltage using said rate of change.

5. The method of claim 4 further comprising the step of smoothly increasing power up to said portion over a period of time.

6. The method of claim 5 wherein said period of time being at least one second.

* * * * *